(12) United States Patent
Nagai

(10) Patent No.: US 10,475,740 B2
(45) Date of Patent: Nov. 12, 2019

(54) FUSE STRUCTURE OF DYNAMIC RANDOM ACCESS MEMORY

(71) Applicants: UNITED MICROELECTRONICS CORP., Hsin-Chu (TW); Fujian Jinhua Integrated Circuit Co., Ltd., Quanzhou, Fujian Province (CN)

(72) Inventor: Yukihiro Nagai, Saijo (JP)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 22 days.

(21) Appl. No.: 15/954,567

(22) Filed: Apr. 16, 2018

(65) Prior Publication Data

US 2019/0287899 A1 Sep. 19, 2019

(30) Foreign Application Priority Data

Mar. 14, 2018 (CN) .......................... 2018 1 0210023

(51) Int. Cl.
*H01L 23/525* (2006.01)
*H01L 29/06* (2006.01)
*H01L 29/423* (2006.01)
*H01L 27/108* (2006.01)

(52) U.S. Cl.
CPC ........ *H01L 23/5256* (2013.01); *H01L 27/108* (2013.01); *H01L 29/0649* (2013.01); *H01L 29/4236* (2013.01)

(58) Field of Classification Search
CPC ........... H01L 23/5256; H01L 27/11206; H01L 29/4175; H01L 29/408; H01L 27/11; H01L 27/1112
See application file for complete search history.

(56) References Cited

U.S. PATENT DOCUMENTS

| | | | |
|---|---|---|---|
| 5,821,160 A * | 10/1998 | Rodriguez | .............. H01L 27/11 438/601 |
| 6,667,902 B2 | 12/2003 | Peng | |
| 8,049,299 B2 | 11/2011 | Min et al. | |
| 9,443,860 B1 * | 9/2016 | Sung | ................. H01L 27/11206 |
| 9,589,970 B1 | 3/2017 | Tseng et al. | |
| 2015/0028411 A1 * | 1/2015 | Lee | ..................... H01L 29/7827 257/330 |
| 2017/0358368 A1 | 12/2017 | Luan et al. | |

* cited by examiner

*Primary Examiner* — Roy K Potter
(74) *Attorney, Agent, or Firm* — Winston Hsu

(57) ABSTRACT

A fuse structure for dynamic random access memory (DRAM) includes: a shallow trench isolation (STI) in a substrate; a first select gate in the substrate and adjacent to one side of the STI; a second select gate in the substrate and adjacent to another side of the STI; and a gate structure on the STI, the first select gate, and the second select gate.

20 Claims, 9 Drawing Sheets

FUSE STRUCTURE OF DYNAMIC RANDOM ACCESS MEMORY

BACKGROUND OF THE INVENTION

1. Field of the Invention

The invention relates to a method for fabricating semiconductor device, and more particularly, to a method of fabricating fuse structure of a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a fuse structure for dynamic random access memory (DRAM) includes: a shallow trench isolation (STI) in a substrate; a first select gate in the substrate and adjacent to one side of the STI; a second select gate in the substrate and adjacent to another side of the STI; and a gate structure on the STI, the first select gate, and the second select gate.

According to another aspect of the present invention, a fuse structure for dynamic random access memory (DRAM) includes: a shallow trench isolation (STI) in a substrate; a first select gate in the substrate and adjacent to one side of the STI; a second select gate in the substrate and adjacent to another side of the STI; a first assist gate in the substrate and between the STI and the first select gate; a second assist gate in the substrate and between the STI and the second select gate; and a gate structure on the STI, the first assist gate, and the second assist gate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
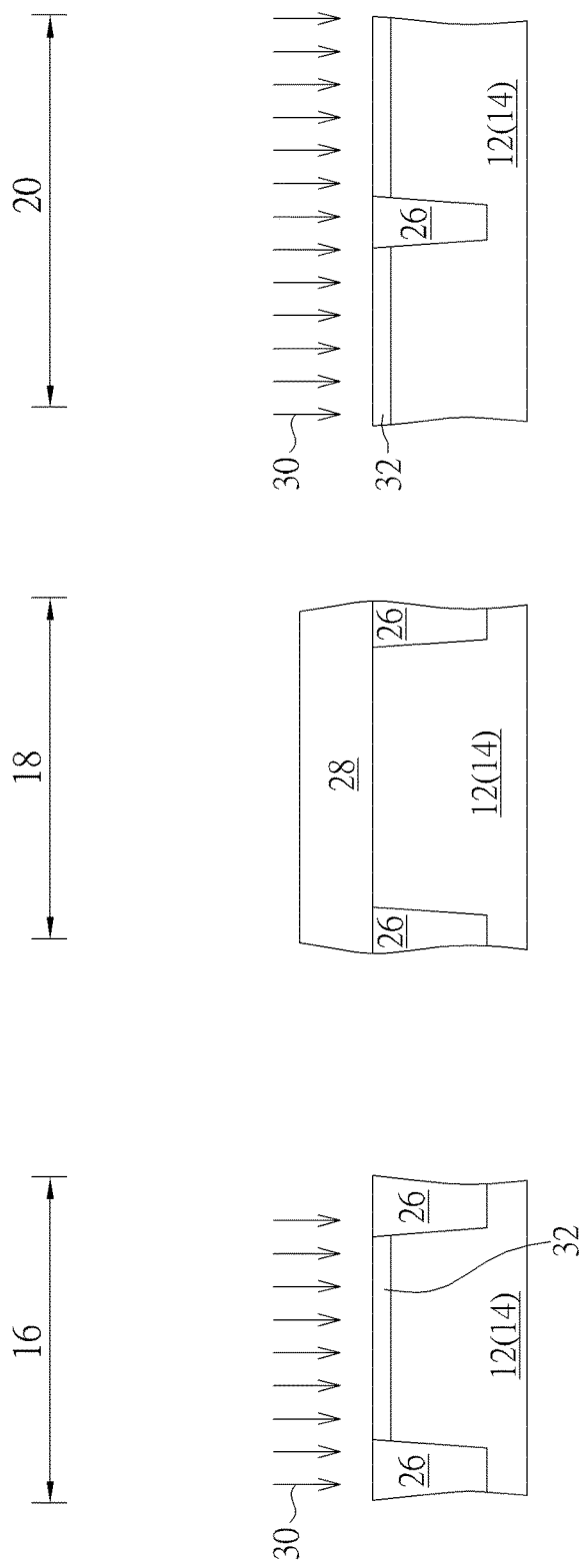
FIGS. 1-7 illustrate a method for fabricating a fuse structure of a DRAM device according to an embodiment of the present invention.

Referring to FIGS. 1-7, FIGS. 1-7 illustrate a method for fabricating a fuse structure of a DRAM device according to an embodiment of the present invention. As shown in FIG. 1, a substrate 12 such as a silicon-on-insulator (SOI) substrate is provided, a well region such as a p-well 14 is formed in the substrate 12, and a cell region 16, a periphery region 18, and a fuse region 20 are defined on the substrate 12. According to an embodiment of the present invention, the periphery region 18 could further includes a first region used for fabricating high voltage (HV) device capable of sustaining high voltages and a second region used for fabricating metal-oxide semiconductor (MOS) transistor with regular voltages. For simplicity purpose, only one type of device is illustrated in the periphery region 18 in this embodiment.

Next, a shallow trench isolation (STI) 26 is formed in the substrate on the cell region 16, the periphery region 18, and the fuse structure 20, a patterned mask such as patterned resist 28 is formed on the substrate 12 on the periphery region 18, and an ion implantation process 30 is conducted to implant n-type dopants (or more specifically n- dopants) into the substrate 12 to form a doped region 32 or more specifically a n-region in the substrate 12 on the cell region 16 and the fuse region 20.

Figure 2:
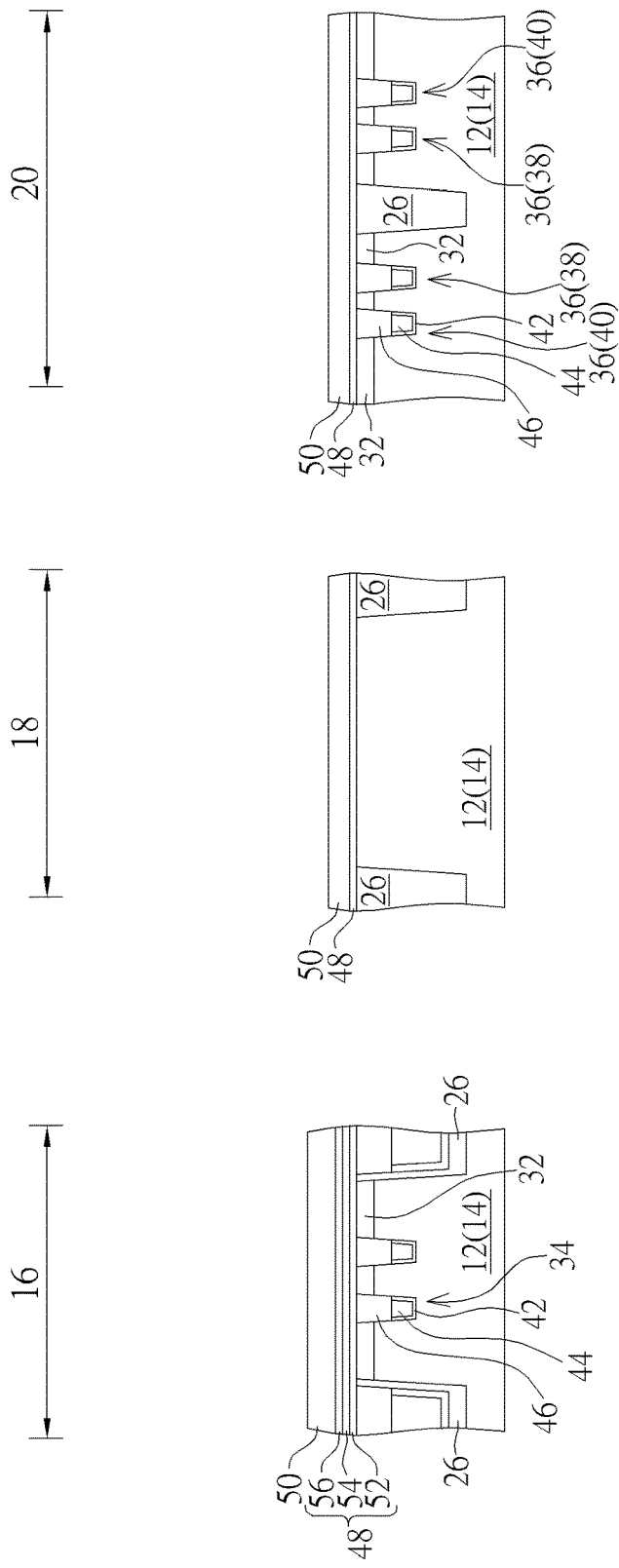

Next, as shown in FIG. 2, a plurality of buried gate structures 34 are formed in the substrate 12 and STI 26 on the cell region 16 and buried gate structures 36 are formed in the substrate 12 on the fuse region 20, in which the gate structures 34 in the substrate 12 on cell region 16 are used buried word lines (BWLs) of the memory cell while the gate structures 36 in the fuse region 20 are serving as assist gates 38 and select gates 40. In this embodiment, the formation of the gate structures 34, 36 could be accomplished by first conducting a photo-etching process to form a plurality of trenches in the substrate 12 and STI 26 on the cell region 16 and the substrate 12 on the fuse region 20, forming a barrier layer 42 and a conductive layer 44 into the trenches, and then conducting an etching back process to remove part of the conductive layer 44 and part of the barrier layer 42 so that the top surface of the remaining conductive layer 44 and barrier layer 42 is slightly lower than the top surface of the substrate 12 to form gate structures 34, 36 in the trenches. Next, a hard mask 46 is formed on each of the gate structure 34, 36, in which the top surface of the hard mask 46 is even with the top surface of the substrate 12.

In this embodiment, the barrier layer 42 preferably includes a work function metal layer which could be a n-type work function metal layer or p-type work function metal layer depending on the demand of the process or product. For instance, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalumaluminide (TaAl), hafniumaluminide (HfAl), or titanium aluminum carbide (TiAlC), but not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto. The conductive layer 44 could be made of low resistance material including but not limited to for example Cu, Al, W, TiAl, CoWP, or combination thereof and the hard mask 46 is preferably made of dielectric material such as silicon nitride.

Next, a dielectric layer 48 and a semiconductor layer 50 are formed on the surface of the substrate 12 on the cell region 16, the periphery region 18, and the fuse region 20. In this embodiment, the dielectric layer 48 in the cell region 16 preferably includes a multi-layered stack structure containing a silicon oxide layer 52, a silicon nitride layer 54, and another silicon oxide layer 56 and the dielectric layer 48 on the periphery region 18 and the fuse region 20 is serving as a gate dielectric layer. The dielectric layer 48 on the periphery region 18 is preferably made of silicon oxide, and if a first region and a second region used for fabricating HV device and regular voltage device were to be defined on the periphery region 18 as disclosed previously, the dielectric layer on the first region and the second region would preferably include different thicknesses. For instance, the thickness of the dielectric layer for the HV device is preferably greater than the thickness of the dielectric layer for the regular voltage device. The dielectric layer 48 on the fuse region 20 is made of silicon oxide having uniform thickness, and the semiconductor layer 50 disposed on the cell region 16, the periphery region 18, and the fuse region 20 is preferably made of amorphous silicon or polysilicon, but not limited thereto.

Figure 3:
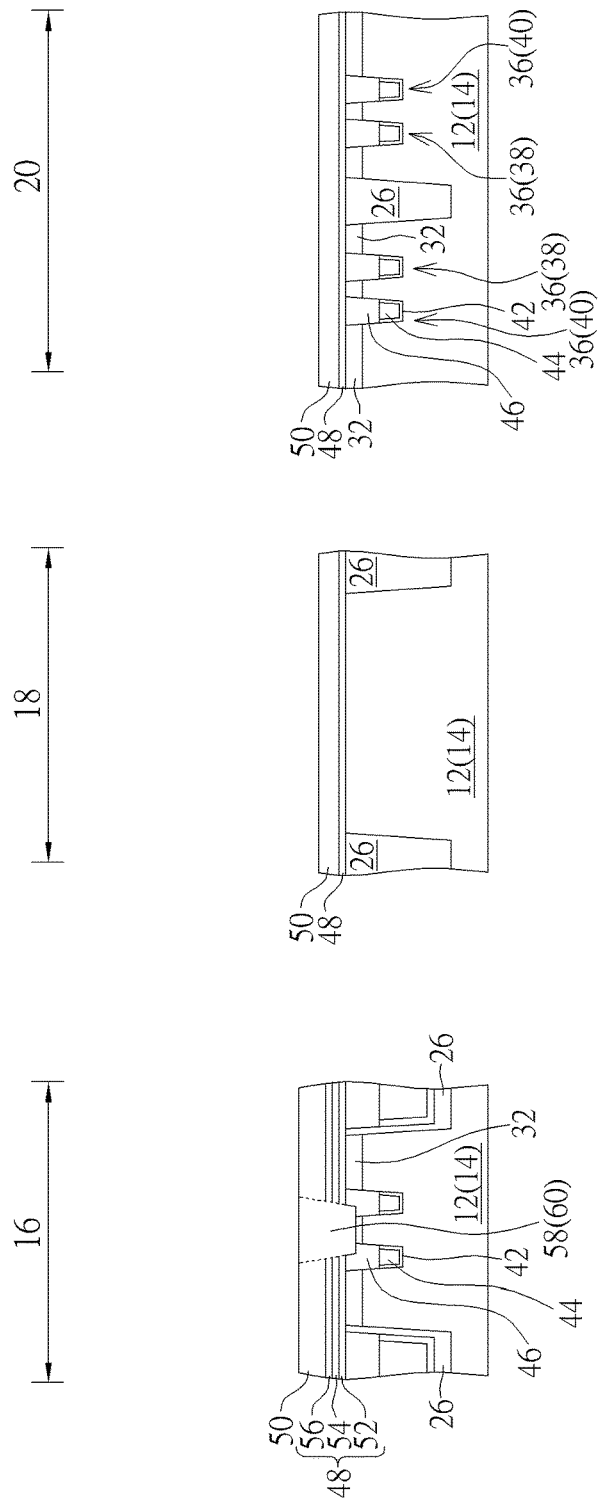

Next, as shown in FIG. 3, a photo-etching process is conducted to remove part of the semiconductor layer 50, part of the dielectric layer 48, part of the hard mask 46, and part of the substrate 12 to from a trench (not shown in the substrate 12, and a non-metal conductive layer 58 is formed to fill the trench completely and on the surface of the semiconductor layer 50. Next, a planarizing process such as an etching back process or a chemical mechanical polishing (CMP) process is conducted to remove part of the conductive layer 58 so that the top surface of the remaining conductive layer 58 is even with the top surface of the semiconductor layer 50. Preferably, the remaining conductive layer 58 or the portion of conductive layer 58 directly contacting the substrate 12 is serving as a bit line contact 60.

Figure 4:
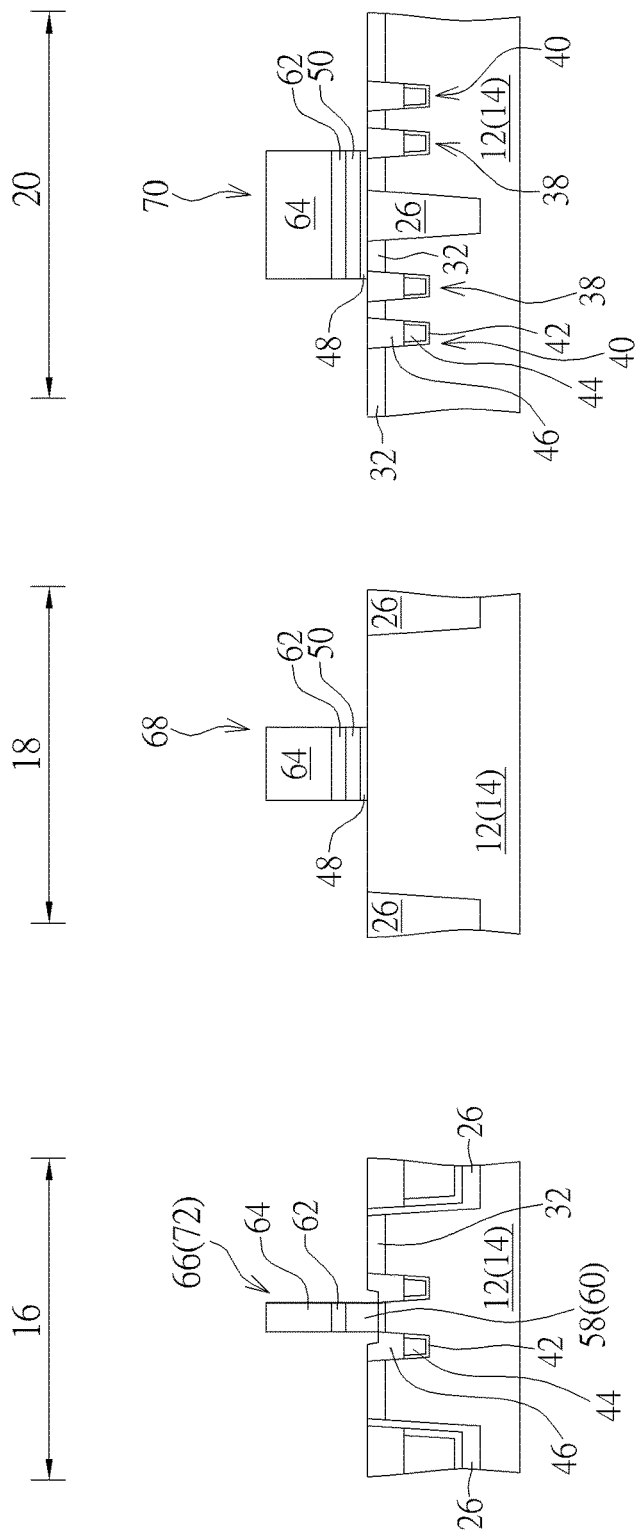

Next, as shown in FIG. 4, at least a metal layer 62 is formed on the semiconductor layer 50 on the cell region 16, the periphery region 18, and the fuse region 20, a mask layer 64 is formed on the metal layer 62 thereafter, and another photo-etching process is conducted to remove part of the mask layer 64, part of the metal layer 62, part of the semiconductor layer 50, and part of the conductive layer 58 to form gate structures 66, 68, 70 on the cell region 16, the periphery region 18, and the fuse region 20 respectively. Preferably, the gate structures 66, 68, 70 could also be referred to as memory gate structures while the gate structure 66 on the cell region 16 is also serving as a bit line structure 72. In this embodiment, the non-metal conductive layer 58 is preferably made of epitaxial material such as silicon phosphide (SiP), but could also include polysilicon, amorphous silicon, other silicon-containing or non-silicon containing non-metal conductive material, the metal layer 62 could include Al, W, Cu, TiAl alloy, or other low resistance metal conductive material, and the mask layer 64 could include SiN, SiON, SiCN, or other insulating material.

Figure 5:
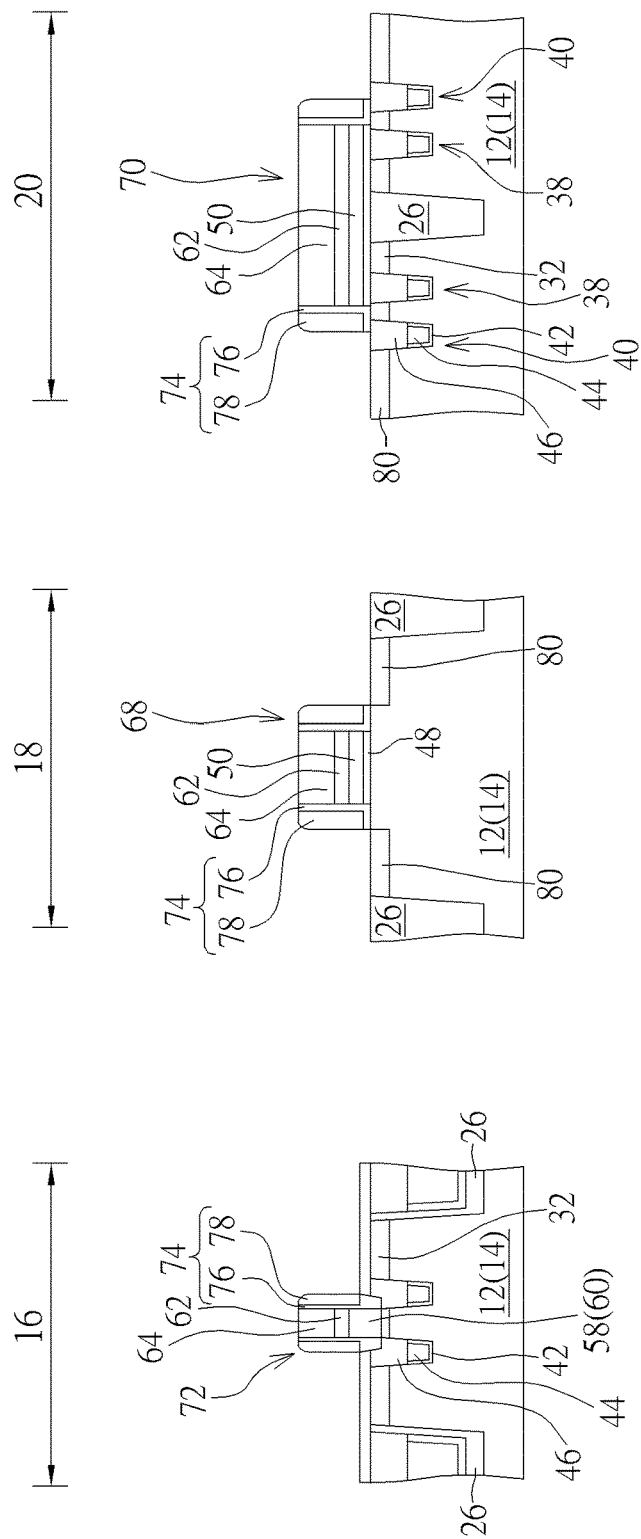

Next, as shown in FIG. 5, a liner (not shown) is formed on the substrate 12 to cover the gate structures 66, 68, 70 on the cell region 16, the periphery region 18, and the fuse region 20, and part of the liner is removed through etching process to form a spacer 74 on the sidewalls of each of the gate structures 66, 68, 70. Next, an ion implantation process is conducted to implant n-type dopants in the substrate 12 adjacent to two sides of each of the gate structures 66, 68, 70 for forming doped regions 80 serving as lightly doped drains source/drain regions. In this embodiment, the concentration of the doped regions 80 preferably higher than the concentration of the aforementioned doped region 32 and even though the depth of the doped region 80 is substantially the same as the depth of the doped region 32, according to another embodiment of the present invention, it would also be desirable to adjust the energy of the ion implantation process so that the depth of the doped regions 80 could also be greater than the depth of the doped region 32, which is also within the scope of the present invention. In this embodiment, the spacer 74 could be a single spacer or a composite spacer further including an offset spacer 76 and a main spacer 78, in which the offset spacer 76 and the main spacer 78 could include different materials such as dielectric materials including but not limited to for example $SiO_2$, SiN, SiON, SiCN, or combination thereof.

Figure 6:
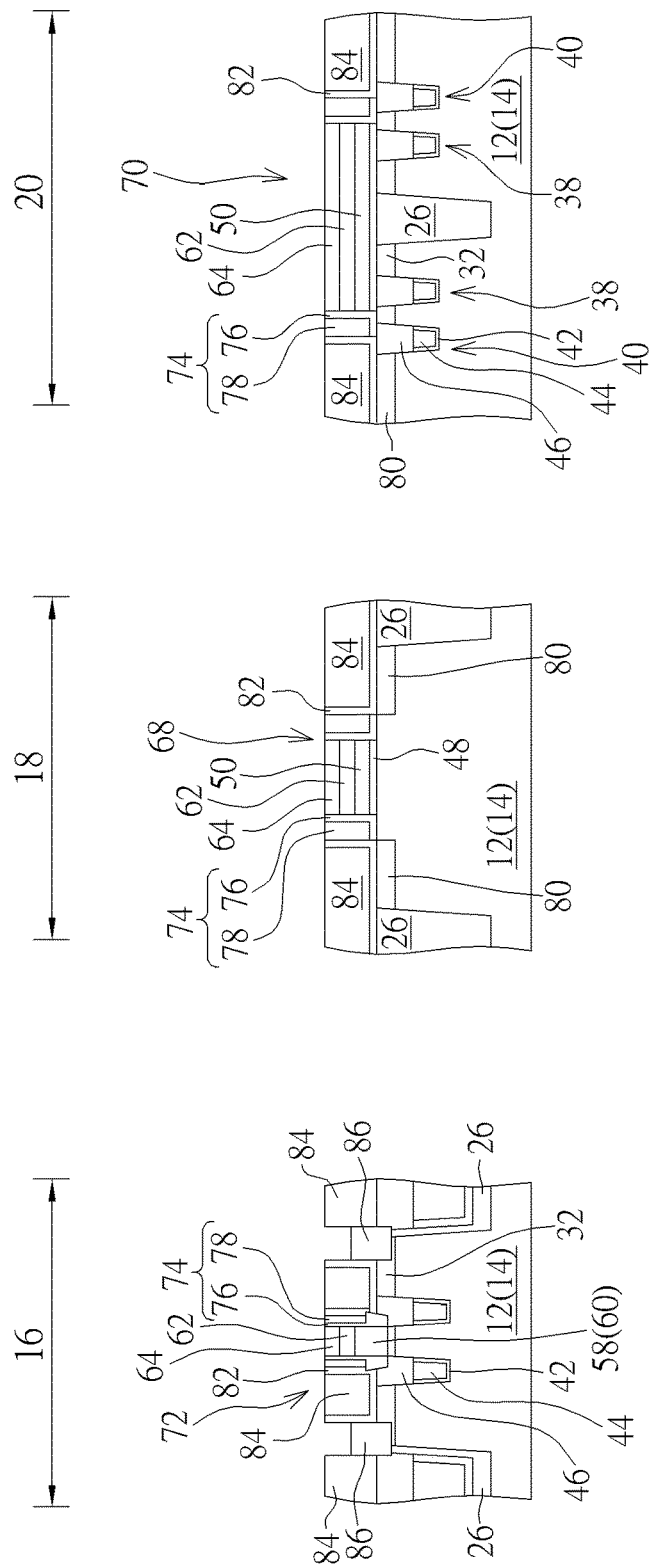

Next, as shown in FIG. 6, a contact etch stop layer (CESL) 82 and an interlayer dielectric (ILD) layer 84 are sequentially formed to cover the gate structures 66, 68, 70 on the cell region 16, the periphery region 18, and the fuse region 20, and a planarizing process such as CMP is conducted to remove part of the ILD layer 84 and part of the CESL 82 so that the top surface of the ILD layer 84 and CESL 82 is substantially even with the top surface of the gate structures 66, 68, 70.

Next, storage node contacts 86 on the cell region 16 are formed by first conducting a photo-etching process to remove part of the ILD layer 84 on the cell region 16 to form contact holes adjacent to two sides of the bit line structure 72, and then forming a conductive layer (not shown) in the contact holes to form storage node contacts 86 adjacent to two sides of the bit line structure 72.

Figure 7:
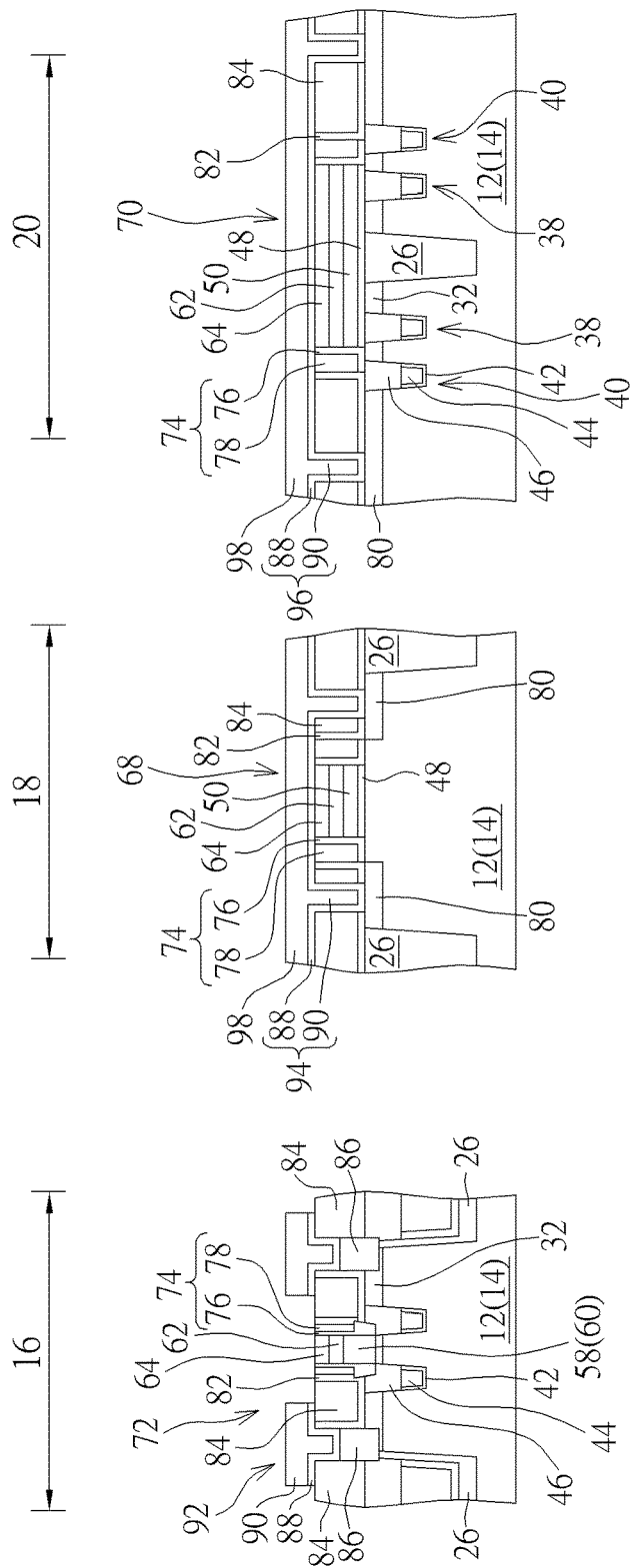

Next, as shown in FIG. 7, a photo-etching process is conducted to remove part of the ILD layer 84 on the periphery region 18 and fuse region 20 to form contact holes adjacent to two sides of the gate structures 68, 70, a barrier layer 88 and another conductive layer 90 are sequentially formed in the contact holes on the cell region 16, the periphery region 18, and the fuse region 20, and another photo-etching process is conducted to remove part of the conductive layer 90 and part of the barrier layer 88 to form storage node pads 92 on the storage node contacts 86 on cell region 16 and at the same time form contact plugs 94, 96 and metal interconnections 98 on the periphery region 18 and fuse region 20 to electrically connect the bit line structure 72. In this embodiment, the barrier layer 88 could include TiN, TaN, or combination thereof and the conductive layer 90 could include Al, Cr, Cu, Ta, Mo, W, or combination thereof. This completes the fabrication of a DRAM device according to an embodiment of the present invention.

Referring again to FIG. 7, which further illustrates a structural view of a fuse structure according to an embodiment of the present invention. As shown in FIG. 7, the fuse structure on the fuse region 20 preferably includes a STI 26 disposed in the substrate 12, a select gate 40 disposed in the substrate 12 adjacent to the left side of the STI 26, a select gate 40 disposed in the substrate 12 adjacent to the right side of the STI 26, an assist gate 38 disposed in the substrate 12 and between the STI 26 and the select gate 40 on the left, an assist gate 38 disposed in the substrate and between the STI 26 and the select gate 40 on the right, and a gate structure 70 disposed on the STI 26 and part of the assist gates 38.

In this embodiment, each of the select gates 40 and assist gates 38 includes a barrier layer 42 disposed on the substrate 12 and a conductive layer 44 disposed on the barrier layer 42, a hard mask 46 is disposed on each of the select gates 40 and assist gates 38, and the top surface of the hard mask 46 is even with the top surface of the STI 26. The fuse structure also includes a doped region 32 disposed between the STI 26 and the assist gates 38 and a spacer 74 around the gate structure 70 while sitting on the assist gates 38. Preferably, the gate structure 70 overlaps the doped region 32 and the two assist gates 38, the bottom surface of the doped region 32 is preferably higher than the top surface of the assist gates 38, and the doped region 32 is preferably made of a n- doped region.

It should be noted that even though the bottom surface of the doped region 32 (or n- region) is slightly higher than the top surface of the select gates 40 and assist gates 38, according to other embodiments of the present invention, it would also be desirable to adjust the energy of the aforementioned ion implantation process 30 conducted in FIG. 1 so that the bottom surface of the doped region 32 is even with or even lower than the top surface of the select gates 40 and assist gates 38, which are all within the scope of the present invention.

Figure 8:
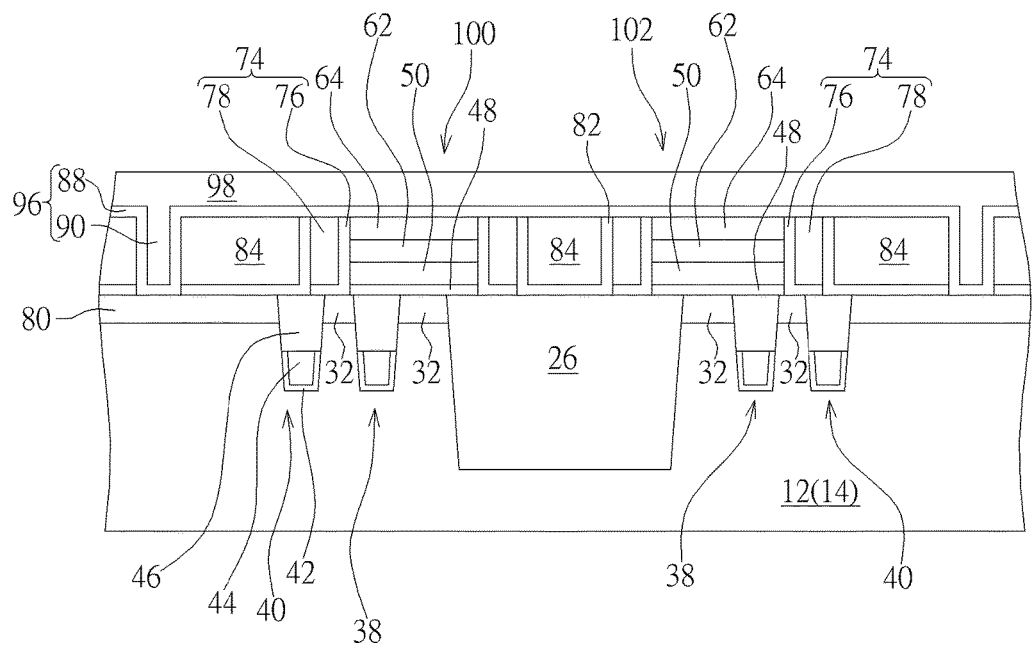
FIG. 8 illustrates a structural view of a fuse structure according to an embodiment of the present invention.

Referring to FIG. 8, FIG. 8 illustrates a structural view of a fuse structure according to an embodiment of the present invention. As shown in FIG. 8, in contrast to the aforementioned embodiment of disposing only a single gate structure 70 on the substrate 12 and the STI 26, it would also be desirable to adjust the position of the patterned mask during the process conducted between FIGS. 3-4 to form two gate structures on the substrate 12 and STI 26 on the fuse region 20, and then continue with the process conducted from FIGS. 5-7 thereafter. In other words, in contrast to the aforementioned embodiment of pairing a single memory gate structure with two sets of buried gate structures (including a set of assist gates and a set of select gates), this embodiment preferably includes a pair of memory gate structures with two pairs of buried gate structures.

Specifically, the gate structure of this embodiment includes two portions, including a first gate structure 100 disposed on part of the STI 26 and the left assist gate 38 and a second gate structure 102 disposed on part of the STI 26 and the right assist gate 38.

Similar to the embodiment shown in FIG. 7, each of the first gate structure 100 and the second gate structure 102 includes a dielectric layer 48, a semiconductor layer 50, a metal layer 62, and a mask layer 64 and a spacer 74 is disposed on the sidewalls of each of the first gate structure 100 and the second gate structure 102.

Figure 9:
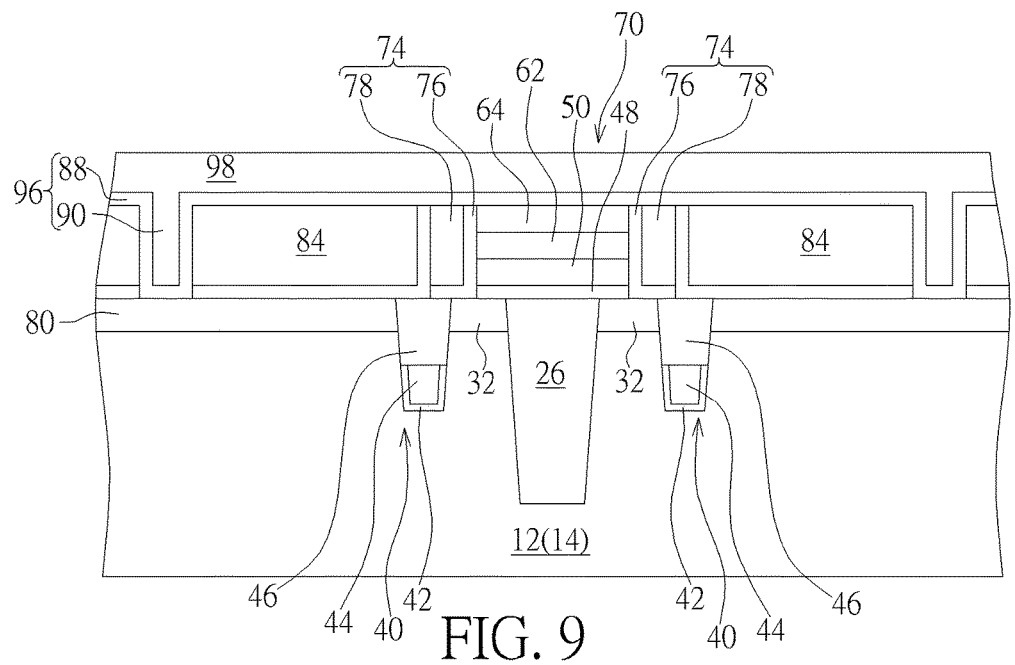
FIG. 9 illustrates a structural view of a fuse structure according to an embodiment of the present invention.

Referring to FIG. 9, FIG. 9 illustrates a structural view of a fuse structure according to an embodiment of the present invention. As shown in FIG. 9, in contrast to the aforementioned embodiment shown in FIG. 7 of forming select gates and assist gates in the substrate adjacent to two sides of the gate structure, it would also be desirable to conduct the process from FIGS. 1-2 by only forming one set of gate structures serving as select gates 40 in the substrate adjacent to two sides of the STI 26 and then continue with the fabrication process from FIGS. 5-7 thereafter. In other words, in contrast to the aforementioned embodiment of pairing a single memory gate structure with two sets of buried gate structures, this embodiment pertains to pair a single memory gate structure 70 with only one set of buried gate structures (such as one set of select gates 40) in the substrate 12.

Similar to the embodiment shown in FIG. 7, the gate structure 70 includes a dielectric layer 48, a semiconductor layer 50, a metal layer 62, and a mask layer 64 and a spacer 74 is disposed on the sidewalls of the gate structure 70.

Figure 10:
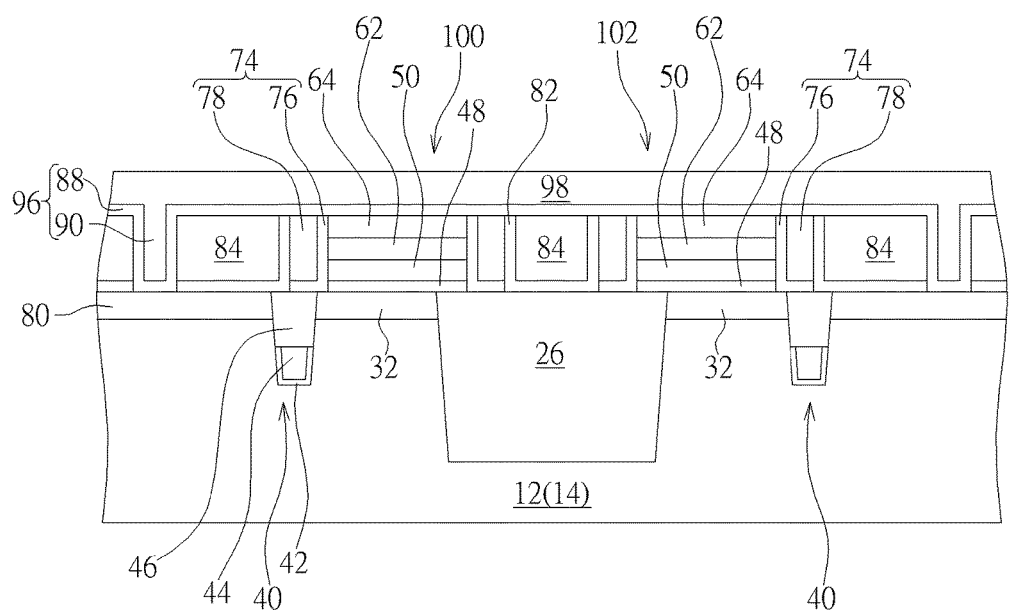
FIG. 10 illustrates a structural view of a fuse structure according to an embodiment of the present invention.

Referring to FIG. 10, FIG. 10 illustrates a structural view of a fuse structure according to an embodiment of the present invention. As shown in FIG. 10, in contrast to the aforementioned embodiment shown in FIG. 9 of pairing a single memory gate structure with one set of buried gate structures in the substrate, it would also be desirable to combine the embodiments from FIGS. 8-9 to form a pair of memory gate structures 100, 102 on the substrate 12 and one set of select gates 40 in the substrate 12 adjacent to two sides of the STI 26.

Similar to the embodiment shown in FIG. 7, each of the first gate structure 100 and the second gate structure 102 includes a dielectric layer 48, a semiconductor layer 50, a metal layer 62, and a mask layer 64 and a spacer 74 is disposed on the sidewalls of each of the first gate structure 100 and the second gate structure 102.

Overall, the present invention preferably forms a fuse structure having elements such as memory gates, select gates and even assist gates on a fuse region when the fabrication of a DRAM device is conducted on the cell region and periphery region, in which the memory gate (or gates) formed on the fuse region preferably sharing identical components and materials as the gate structures on the periphery region and the select gates and assist gates preferably sharing substantially same structure as the buried word lines on the cell region.

Specifically, the fuse structure disclosed in this embodiment is a one time programmable (OTP) memory, which could be used to conduct programming and read operations through the memory gate disposed on the substrate and select and assist gates buried within the substrate. Since the entire fuse structure is fabricated along with the fabrication of the DRAM device, the size of the gate structure of the fuse structure in particular or even the entire memory cell portion could be significantly less than the size of current DRAM device.

Moreover, the present invention also conducts an ion implantation process to form a n- region in the substrate within the cell region and fuse region before memory gates structures are formed so that the device fabricated afterwards would become a depletion type transistor. Since the depletion type transistor has a real channel so that current could be generated when the gate voltage is zero resulting the transistor to be constantly turned on, the fuse structure on the fuse region could be able to perform program and read operations with regards to the memory gates and select gates under a much lower voltage than conventional devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fuse structure for dynamic random access memory (DRAM), comprising:
   a shallow trench isolation (STI) in a substrate;
   a first select gate in the substrate and adjacent to one side of the STI;
   a second select gate in the substrate and adjacent to another side of the STI; and
   a gate structure on the STI, the first select gate, and the second select gate.

2. The fuse structure for DRAM of claim 1, wherein each of the first select gate and the second select gate comprises:
   a barrier layer in the substrate; and
   a conductive layer on the barrier layer.

3. The fuse structure for DRAM of claim 2, further comprising a hard mask on each of the first select gate and the second select gate.

4. The fuse structure for DRAM of claim 3, wherein a top surface of the hard mask is even with a top surface of the STI.

5. The fuse structure for DRAM of claim 1, further comprising a doped region between the STI and the first select gate and the second select gate.

6. The fuse structure for DRAM of claim 5, wherein a bottom surface of the doped region is higher than a top surface of the first select gate.

7. The fuse structure for DRAM of claim 5, wherein the doped region comprises a n- region.

8. The fuse structure for DRAM of claim 1, further comprising a spacer around the gate structure and on the first select gate and the second select gate.

9. The fuse structure for DRAM of claim 1, wherein the gate structure comprises:
   a conductive layer;
   a metal layer on the conductive layer; and
   a mask layer on the metal layer.

10. The fuse structure for DRAM of claim 1, wherein the gate structure further comprises:
    a first gate structure on part of the STI and the first select gate; and
    a second gate structure on part of the STI and the second select gate.

11. A fuse structure for dynamic random access memory (DRAM), comprising:
    a shallow trench isolation (STI) in a substrate;
    a first select gate in the substrate and adjacent to one side of the STI;
    a second select gate in the substrate and adjacent to another side of the STI;
    a first assist gate in the substrate and between the STI and the first select gate;
    a second assist gate in the substrate and between the STI and the second select gate; and
    a gate structure on the STI, the first assist gate, and the second assist gate.

12. The fuse structure for DRAM of claim 11, wherein each of the first select gate, the second select gate, the first assist gate, and the second assist gate comprises:
    a barrier layer in the substrate; and
    a conductive layer on the barrier layer.

13. The fuse structure for DRAM of claim 12, further comprising a hard mask on each of the first select gate, the second select gate, the first assist gate, and the second assist gate.

14. The fuse structure for DRAM of claim 13, wherein a top surface of the hard mask is even with a top surface of the STI.

15. The fuse structure for DRAM of claim 11, further comprising a doped region between the STI and the first assist gate and the second assist gate.

16. The fuse structure for DRAM of claim 15, wherein a bottom surface of the doped region is higher than a top surface of the first select gate.

17. The fuse structure for DRAM of claim 15, wherein the doped region comprises a n- region.

18. The fuse structure for DRAM of claim 11, further comprising a spacer around the gate structure and on the first assist gate and the second assist gate.

19. The fuse structure for DRAM of claim 11, wherein the gate structure comprises:
    a conductive layer;
    a metal layer on the conductive layer; and
    a mask layer on the metal layer.

20. The fuse structure for DRAM of claim 11, wherein the gate structure further comprises:
    a first gate structure on part of the STI and the first assist gate; and
    a second gate structure on part of the STI and the second assist gate.

* * * * *